(12) United States Patent
Lee et al.

(10) Patent No.: US 7,577,057 B2
(45) Date of Patent: Aug. 18, 2009

(54) CIRCUIT AND METHOD FOR GENERATING WRITE DATA MASK SIGNAL IN SYNCHRONOUS SEMICONDUCTOR MEMORY DEVICE

(75) Inventors: Soon-seob Lee, Seongnam-si (KR); Sang-woong Shin, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/607,970

(22) Filed: Dec. 4, 2006

(65) Prior Publication Data

US 2007/0159913 A1 Jul. 12, 2007

(30) Foreign Application Priority Data

Jan. 12, 2006 (KR) .............. 10-2006-0003492

(51) Int. Cl.
*G11C 8/00* (2006.01)
(52) U.S. Cl. .............. 365/233.1; 365/195; 365/196
(58) Field of Classification Search .......... 365/233, 365/195, 196
See application file for complete search history.

(56) References Cited

U.S. PATENT DOCUMENTS

| | | | | |
|---|---|---|---|---|
| 5,226,063 A | * | 7/1993 | Higashitsutsumi | 377/44 |
| 5,386,150 A | * | 1/1995 | Yonemoto | 327/141 |
| 5,539,696 A | * | 7/1996 | Patel | 365/189.01 |
| 5,970,021 A | | 10/1999 | Sakurai | |
| 6,002,615 A | | 12/1999 | Sawada | |
| 7,224,625 B2 | * | 5/2007 | Dietrich et al. | 365/193 |

FOREIGN PATENT DOCUMENTS

| | | |
|---|---|---|
| JP | 09-128961 | 5/1997 |
| JP | 11-066851 | 3/1999 |
| JP | 11-149770 | 6/1999 |
| KR | 10-1999-023078 | 3/1999 |
| KR | 10-1999-0044768 | 6/1999 |

OTHER PUBLICATIONS

Jan M. Rabaey et al., Digital Integrated Circuit, Prentice Hall, pp. 256-262, 3444-346.*

* cited by examiner

*Primary Examiner*—Amir Zarabian
*Assistant Examiner*—Fernando N Hidalgo
(74) *Attorney, Agent, or Firm*—Volentine & Whitt, P.L.L.C.

(57) ABSTRACT

A circuit for generating a write data mask signal in a synchronous semiconductor memory device includes an output unit and a reset control unit. The output unit controls a write data mask operation of the synchronous semiconductor memory device, latches a write data mask signal, and outputs an internal write data mask signal, in response to an internal clock signal. The reset control unit generates a reset signal for resetting the internal write data mask signal, in response to a write column disable signal indicating an activation end point of a column selection line signal generated when a write operation including the write data mask operation is performed. While the synchronous semiconductor memory device performs a gapless write data mask operation included in a gapless write operation, the reset signal is deactivated so that the write data mask signal is not reset.

11 Claims, 4 Drawing Sheets

CIRCUIT AND METHOD FOR GENERATING WRITE DATA MASK SIGNAL IN SYNCHRONOUS SEMICONDUCTOR MEMORY DEVICE

BACKGROUND OF THE INVENTION

1. Field of the Invention

The present invention relates to a synchronous semiconductor memory device. More particularly, the present invention relates to a circuit and method for generating a write data mask signal in a synchronous semiconductor memory device.

This application claims the benefit of Korean Patent Application No. 10-2006-0003492, filed on Jan. 12, 2006, the disclosure of which is hereby incorporated by reference.

2. Description of Related Art

In general, a semiconductor memory device includes a matrix type memory cell array and reads/writes data from/to a particular memory cell in the memory cell array in accordance with certain control signals, such as read/write commands, a row address, a column address, etc.

The operating speed of conventional synchronous memory devices has historically been relatively low. This limitation precluded their use in high performance memory systems. More recently, however, the operating speed of synchronous memory devices, both single data rate synchronous DRAM (SDR SDRAM) or a double data rate synchronous DRAM (DDR SDRAM), has been significantly improved to the point where such devices may be incorporated into high performance memory systems.

Conventional SDR SDRAM input and output data on the rising or falling edge of a clock signal. In contrast, DDR SDRAM inputs and outputs data on both the rising and falling edges of a clock signal. Thus, factors other than clock speed not considered, DDR SRAM provide twice the data throughput of SDR SDRAM.

DDR SDRAM typically includes a data input mask pin (DM pin) adapted to mask data which need not be written. Accordingly, such data is not input when the write data mask signal is activated. In other words, when a write operation is performed and data in a specific "masked" memory cell is not changed.

Figure (FIG.) 1 is a circuit diagram of a conventional circuit 10 adapted to generate a write data mask signal useful in a synchronous memory device.

Referring to FIG. 1, the conventional write data mask signal generating circuit 10 includes an OR gate 11, an inverter 12, a NOR gate 13, a D latch 14, and an NMOS transistor 15.

D latch 14 latches a write data mask signal DM which is supplied from outside the synchronous memory device and is activated to a logic high level, in response to an internal clock signal CLK. D latch 14 outputs an internal write data mask signal DMO. The internal clock signal CLK is obtained by delaying an external system clock signal (not shown).

The internal write data mask signal DMO enables a memory cell to hold previous input data (or previously written data) instead of overwriting it with new data input through data input/output pins (DQ pins). In other words, the internal write data mask signal DMO controls a write data mask operation of the synchronous memory device.

For example, the internal write data mask signal DMO may deactivate a data input/output buffer included in a write data path or deactivate (or turn OFF) a column selection switch connected to a column selection line (CSL) included in an address path. The column selection switch selectively connects a bit line leading to the memory cell to an input/output line leading from a data input/output pin.

OR gate 11 generates a reset signal RST in response to a read signal RD or a write column disable signal CSLF_W.

NMOS transistor 15 resets (deactivates) the internal write data mask signal DMO from a logic high level to a logic low level in response to a reset signal RST.

Reset of the internal write data mask signal DMO is necessary when a write operation including a write data mask operation is completed and a read operation begins, because if the internal write data mask signal DMO is activated to a logic high level it will deactivate the data input/output buffer or the column selection switch used in the read operation, thereby interrupting the read operation.

The read signal RD indicates the read operation within the synchronous memory device and is delayed from an externally applied read command. Accordingly, in order to perform a read operation following a write data mask operation in the synchronous memory device, a write column disable signal CSLF_W is additionally used as the reset signal RST, because the internal write data mask signal DMO cannot otherwise be timely reset.

The write column disable signal CSLF_W indicates an activation end point of the column selection line signal generated when the write operation including the write data mask operation is performed. The column selection line signal controls the switching of the column selection switch.

The conventional write data mask signal generating circuit 10 resets the internal write data mask signal DMO when each individual write operation is completed. Accordingly, in a gapless write operation including a gapless write data mask operation in which a portion of the input data successively written through the data input/output pins is successively masked, the write data mask signal generating circuit 10 may not properly generate the internal write data mask signal DMO for the gapless write mask operation.

In particular, during an activation time interval of the write column disable signal CSLF_W, which enables the reset signal RST corresponding to the previous write data in the gapless write data mask operation to be generated, the internal write data mask signal DMO corresponding to current write data in the gapless write data mask operation is not activated. Accordingly, for the write data mask operation of the current write data, additional time is needed for deactivating the activated write column disable signal CSLF_W. This additional time restricts the operation of the gapless write operation and prevents high-speed operation of the synchronous memory device. The gapless write operation is included in the write operation and the gapless write data mask operation is not included in each individual data mask operation.

SUMMARY OF THE INVENTION

Embodiments of the invention provides a circuit and method for generating a write data mask signal in a synchronous memory device which allows a write data mask operation to be performed normally in a gapless write operation.

In one embodiment, the invention provides a circuit adapted to generate a write data mask signal in a synchronous memory device, comprising; an output unit adapted to control a write data mask operation for the synchronous memory device, latch a write data mask signal, and output an internal write data mask signal in response to an internal clock signal, and a reset control unit adapted to generate a reset signal for resetting the internal write data mask signal in response to a write column disable signal indicating an activation end point of a column selection line signal generated when a write operation including the write data mask operation is performed, wherein the reset signal is deactivated so that the write data mask signal is not reset while the synchronous semiconductor memory device performs a gapless write data mask operation included in a gapless write operation.

In another embodiment, the invention provides a method of generating a write data mask signal in a synchronous memory device, comprising; latching a write data mask signal for controlling a write data mask operation of the synchronous memory device and activating an internal write data mask signal in response to an internal clock signal, detecting whether the synchronous memory device performs a gapless write data mask operation included in a gapless write operation, upon detecting the gapless write data mask operation, holding the internal write data mask signal during the gapless write data mask operation and then resetting the activated internal write data mask signal using a write column disable signal indicating an activation end point of a column selection line signal generated when a write operation including the write data mask operation is performed, and upon detecting an individual write data mask operation, resetting the activated internal write data mask signal using the write column disable signal.

DESCRIPTION OF EMBODIMENTS

Figure 1:
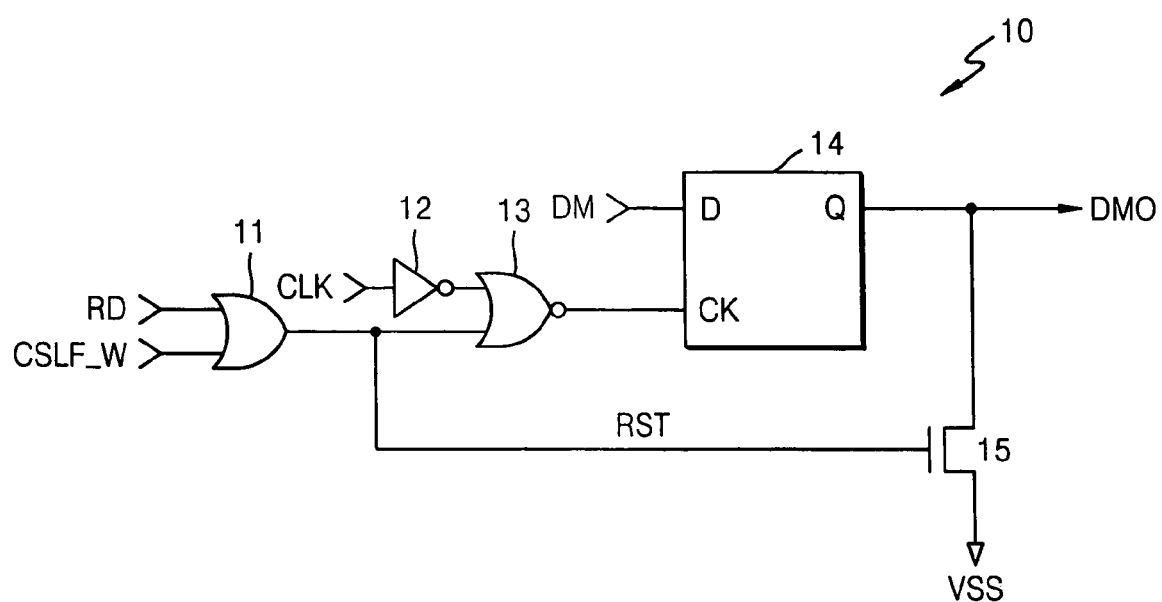
FIG. 1 is a circuit diagram illustrating a conventional circuit for generating a write data mask signal in a synchronous semiconductor memory device.

The attached drawings illustrate exemplary embodiments of the present invention. The present invention will now be described in some additional detail with reference to the illustrated exemplary embodiments. Like reference numerals denote like or similar elements in the drawings.

Figure 2:
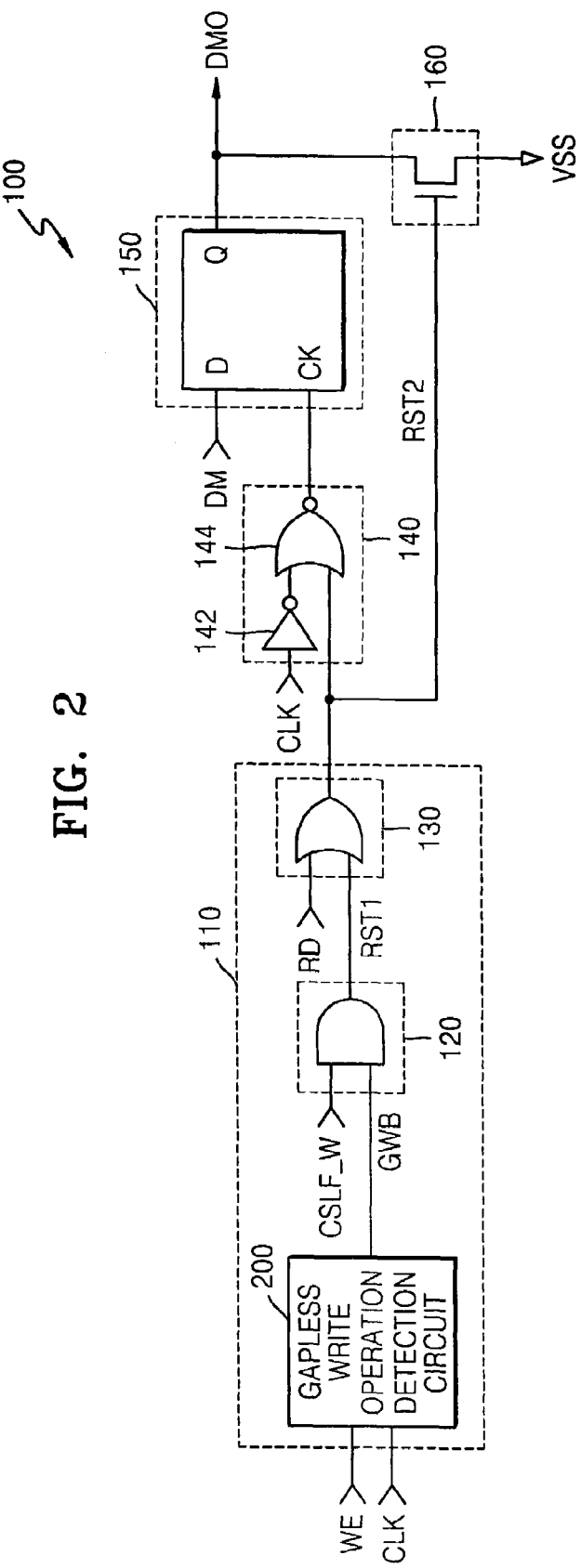
FIG. 2 illustrates a circuit for generating a write data mask signal in a synchronous semiconductor memory device according to an embodiment of the present invention.

FIG. 2 illustrates a circuit 100 adapted to generate a write data mask signal in a synchronous memory device in accordance with an embodiment of the invention.

Referring to FIG. 2, write data mask signal generating circuit 100 includes a reset control unit 110, a clock input unit 140, an output unit 150, and a reset unit 160.

Output unit 150 latches an externally supplied write data mask signal DM and outputs an internal write data mask signal DMO in response to an internal clock signal CLK. The internal clock signal CLK is obtained by delaying an external system clock signal (not illustrated). The activation state of the write data mask signal DM is, for example, at a logic high level. In the illustrated example, output unit 150 is implemented by a conventional D latch circuit.

The internal write data mask signal DMO activated to a logic high level enables a memory cell storing previously written data to retain the data instead of overwriting it with data input through data input/output pins (DQ pins). In other words, the internal write data mask signal DMO controls a write data mask operation for the synchronous memory device.

For example, the internal write data mask signal DMO may deactivate a data input/output buffer included in a write data path or deactivate (or turn OFF) a column selection switch connected to a column selection line included in an address path. The column selection switch selectively connects a bit line leading to the memory cell to an input/output (I/O) line leading from a data input/output pin.

Reset control unit 110 generates a reset signal RST2 adapted to reset the internal write data mask signal DMO in response to a write column disable signal CSLF_W indicating the activation end point of a column selection line signal generated when a write operation including the write data mask operation is performed. While the synchronous memory device performs a gapless write data mask operation included in a gapless write operation, the reset signal RST2 is deactivated so that the internal write data mask signal DMO is not reset. The column selection line signal controls the switching of the column selection switch.

When the synchronous semiconductor memory device completes an individual write data mask operation, not the gapless write data mask operation, reset control unit 110 resets the internal write data mask signal DMO in response to the write column disable signal (CSLF_W) corresponding to the end of the individual write data mask operation.

In other words, the internal write data mask signal DMO is reset to a logic low level so that the synchronous memory device performs a read operation following the write data mask operation. The gapless write data mask operation and the individual write data mask operation are included in the write data mask operation.

When the synchronous memory device performs the gapless write data mask operation included in the gapless write operation of a write operation, reset control unit 110 does not reset the internal write data mask signal DMO during the gapless write data mask operation, but resets the internal write data mask signal DMO using the write column disable signal CSLF_W corresponding to final write data in the gapless write operation.

Accordingly, write data mask signal generating circuit 100 allows the write data mask operation to be performed normally in the gapless write operation. In addition, due to the operation of reset control unit 110 the internal write data mask signal DMO is reset in response to a read signal RD indicating a read operation in the synchronous memory device.

Reset control unit 110 includes a gapless write operation detection circuit 200, a pre-reset control circuit 120, and a reset control circuit 130.

Gapless write operation detection circuit 200 detects gapless write operations corresponding to various types of synchronous memory devices in response to an internal clock signal CLK and a write signal WE indicating a write operation to be performed by the synchronous memory device. Gapless write operation detection circuit 200 then generates an inverted signal GWB derived from a detection signal (not illustrated) indicating a gapless write operation. The write signal WE is generated by an externally applied write command.

Pre-reset control circuit 120 generates a pre-reset signal RST1 adapted to reset the internal write data mask signal DMO in response to the inverted signal GWB of the detection signal and the write column disable signal CSLF_W. In the illustrated embodiment, re-reset control circuit 120 is implemented as an AND gate.

Reset control circuit 130 is adapted to generate a reset signal RST2 for resetting the internal write data mask signal DMO in response to the read signal RD or the pre-reset signal RST1. In the illustrated embodiment, reset control circuit 130 is implemented as an OR gate.

Write data mask signal generating circuit 100 further includes a clock input unit 140 and a reset unit 160. In the illustrated embodiment, clock input unit 140 performs a NOR operation on an inverted signal of the internal clock signal CLK and the reset signal RST2 and provides the result to output unit 150. This particular embodiment of clock input unit 140 includes an inverter 142 and a NOR gate 144.

Reset unit 160 resets (or deactivates) the internal write data mask signal DMO to a logic low level in response to the reset signal RST2. In the illustrated embodiment, reset unit 160 is implemented as an NMOS transistor.

Figure 3:
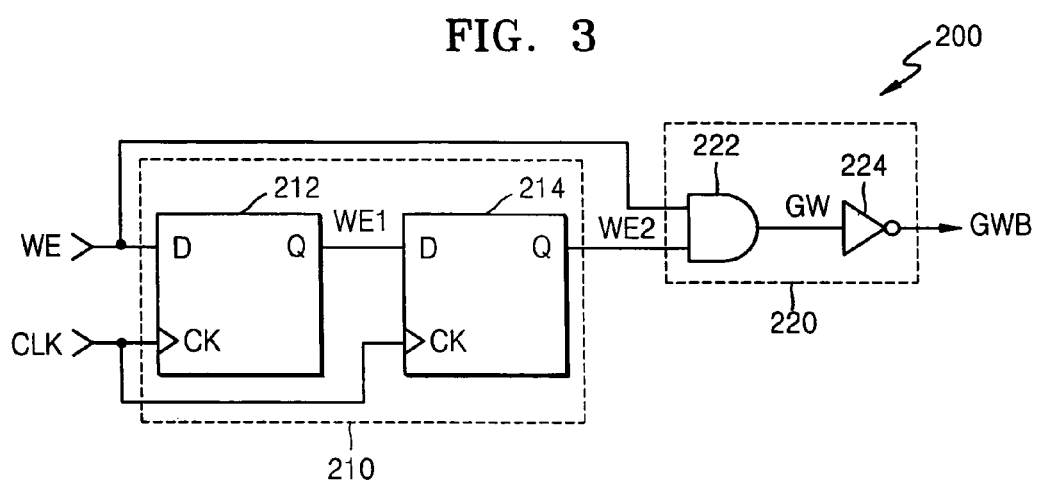
FIG. 3 illustrates a gapless write operation detection circuit illustrated in FIG. 2.

FIG. 3 further illustrates gapless write operation detection circuit 200 indicated in FIG. 2. The exemplary embodiment shown in FIG. 3 is well adapted to the detection of gapless write operation in a DDR2 SDRAM.

Referring to FIG. 3, gapless write operation detection circuit 200 includes a sampling circuit 210 and a detection signal output circuit 220.

Sampling circuit 210 shifts (or samples) the write signal to generate a first delay write signal WE1 and shifts the first delay write signal WE1 to a second delay write signal WE2 in response to the internal clock signal CLK. Sampling circuit 210 is a shift register including two D flip-flops connected in series and operates in response to the internal clock signal CLK.

This particular sampling circuit 210 is well adapted for use with a DDR2 SDRAM because the DDR2 SDRAM pre-fetches 4-bit write data in synchronization with the write signal WE generated every two cycles of the internal clock signal CLK. In other words, the DDR2 SDRAM performs the gapless write operation using a 4-bit pre-fetch scheme. Naturally, other implementations of sampling circuit 210 may be better suited for different pre-fetch schemes. For example, when a DDR SDRAM is assumed to use a 2-bit pre-fetch scheme, sampling circuit 210 may include only a single D flip-flop. The D flip-flop shifts the write signal WE to generate a first delay write signal WE1 in response to the internal clock signal CLK, and provides the first delay write signal WE1 to the detection signal output circuit 220. Similarly, when a synchronous memory device uses an 8-bit pre-fetch scheme, sampling circuit 210 may includes three (3) D flip-flops connected in series.

In the illustrated embodiment, detection signal output circuit 220 includes an AND gate 222 adapted to generate a detection signal GW, and an inverter 224 adapted to generate an inverted signal GWB of the detection signal GW. Detection signal output circuit 220 performs an AND operation on the write signal WE and the second delay write signal WE2 to generate the detection signal GW indicating the gapless write operation of a DDR2 SDRAM, and inverts the detection signal GW to generate an inverted version of signal GWB of the detection signal GW. The detection signal GW indicates the gapless write operation in accordance with various types of the synchronous memory devices.

Figure 4:
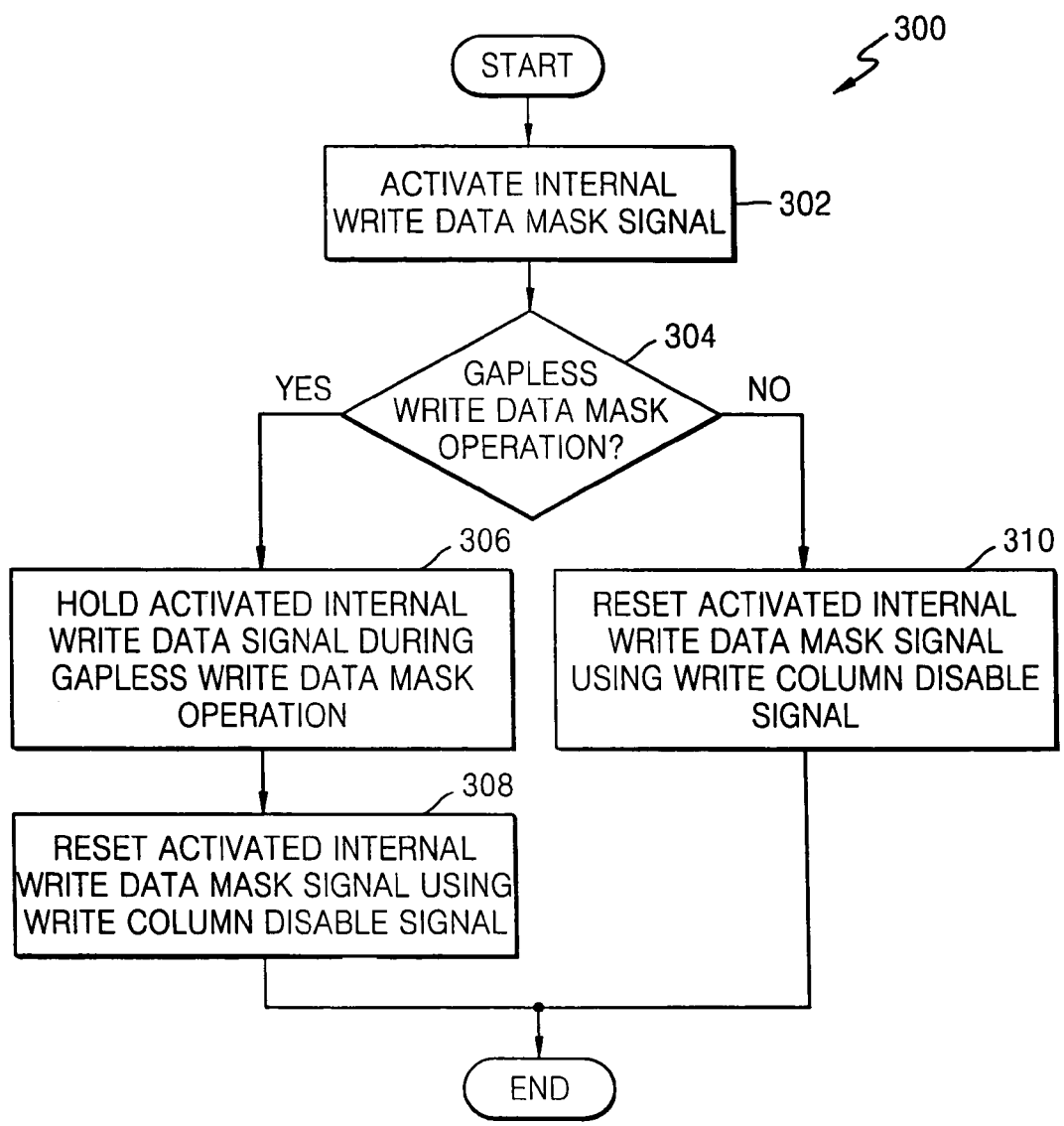
FIG. 4 is a flowchart illustrating a method of generating a write data mask signal in a synchronous semiconductor memory device according to an embodiment of the present invention.

FIG. 4 is a flowchart illustrating a method 300 for generating a write data mask signal in a synchronous memory device according to an embodiment of the invention. The write data mask signal generating method 300 can be applied to the write data mask signal generating circuit 100 illustrated in FIG. 2.

In activation operation 302, output unit 150 latches the write data mask signal DM using the internal clock signal CLK, and activates the internal write data mask signal DMO. The write data mask signal DM controls the write data mask operation of the synchronous semiconductor memory device and is externally supplied. For example, the activation state of the internal write data mask signal DMO may be a logic high level.

In detection operation 304, gapless write operation detection circuit 200 detects whether the synchronous semiconductor memory device is performing the gapless write data mask operation included in the gapless write operation. The gapless write data mask operation is included in the write operation. The gapless write operation detected in detection operation 304 corresponds to the type of the synchronous memory device being used. The type of the synchronous memory device may be, for example, a DDR SDRAM or a DDR2 SDRAM.

If a gapless write data mask operation is detected for the synchronous memory device in detection operation 304, a hold operation 306 is performed. If an individual write data mask operation is detected for the synchronous memory device in detection operation 304, a reset operation 310 is performed. The gapless write data mask operation and the individual write data mask operation are included in the write data mask operation.

In hold operation 306, reset control unit 110 holds the internal write data mask signal DMO in an activation state during the gapless write data mask operation. Accordingly, the write data mask signal generating method according to the illustrated embodiment of the invention allows the write data mask operation to be performed normally in the gapless write operation.

In reset operation 308, reset control unit 110 resets (or deactivates) the activated internal write data mask signal DMO using the write column disable signal CSLF_W corresponding the final write data in the gapless write operation. The write column disable signal CSLF_W indicates the activation end point of the column selection line signal generated when the write operation including the write data mask operation is performed. For example, the deactivation state of the internal write data mask signal DMO may be a logic low level.

In reset operation 310, reset control unit 110 resets the activated internal write data mask signal DMO using the write column disable signal CSLF_W corresponding to the completion of the individual write data mask operation.

While the present invention has been particularly shown and described with reference to exemplary embodiments thereof, it will be understood by those of ordinary skill in the art that various changes in form and detail may be made therein without departing from the scope of the present invention as defined by the following claims.

What is claimed is:

1. A circuit adapted to generate a write data mask signal in a synchronous memory device, comprising:

an output unit adapted to control a write data mask operation for the synchronous memory device, latch a write data mask signal, and output an internal write data mask signal in response to an internal clock signal; and a reset control unit adapted to generate a reset signal for resetting the internal write data mask signal in response to a write column disable signal indicating an activation end point of a column selection line signal generated when a write operation including the write data mask operation is performed, wherein the reset signal is deactivated so that the internal write data mask signal is not reset while the synchronous semiconductor memory device performs a gapless write data mask operation included in a gapless write operation, wherein the reset control unit comprises a gapless write operation detection circuit adapted to detect the gapless write operation of the synchronous memory device and to generate a detection signal, and wherein the reset control unit generates the reset signal based on a logic operation for the detection signal, the write column disable signal and a read signal indicating a read operation for the synchronous memory device.

2. A circuit for generating a write data mask signal in a synchronous memory device, the circuit comprising:

an output unit configured to latch a write data mask signal and to output an internal write data mask signal in response to an internal clock signal in order to control a write data mask operation for the synchronous memory device; and a reset controller configured to generate a reset signal for resetting the internal write data mask signal in response to a write column disable signal indicating an activation end point of a column selection line signal generated when a write operation including the write data mask operation is performed, the reset controller deactivating the reset signal so that the internal write data mask signal is not reset while the synchronous semiconductor memory device performs a gapless write data mask operation included in a gapless write operation, wherein the reset controller comprises:

a gapless write operation detection circuit adapted to detect the gapless write operation in accordance with a type of synchronous memory device and to generate an inverted version of a detection signal indicating the gapless write operation in response to a write signal and the internal clock signal;

a pre-reset control circuit adapted to generate a pre-reset signal in response to the write column disable signal and the inverted version of the detection signal; and a reset control circuit adapted to generate the reset signal in response to at least one of the pre-reset signal and a read signal indicating a read operation for the synchronous memory device.

3. The circuit of claim 2, wherein the pre-reset control circuit comprises an AND gate which operates in response to the write column disable signal and the inverted version of the detection signal.

4. The circuit of claim 2, further comprising a clock input unit which performs a NOR operation on an inverted version of the internal clock signal and the reset signal, and which provides a result of the operation to the output unit.

5. The circuit of claim 2, further comprising a reset unit adapted to reset the internal write data mask signal in response to the reset signal.

6. The circuit of claim 2, wherein the gapless write operation detection circuit comprises:

a sampling circuit which shifts the write signal to generate a first delay write signal and shifts the first delay write signal to generate a second delay write signal, in response to the internal clock signal; and a detection signal output circuit which performs an AND operation on the write signal and the second delay write signal to generate the detection signal, and inverts the detection signal to generate the inverted version of the detection signal.

7. The circuit of claim 6, wherein the sampling circuit comprises a shift register including two D flip-flops connected in series which operates in response to the internal clock signal.

8. The circuit of claim 6, wherein the detection signal output circuit comprises an AND gate adapted to generate the detection signal and an inverter for generating the inverted version of the detection signal.

9. The circuit of claim 2, wherein the gapless write operation detection circuit comprises:

a sampling circuit which shifts the write signal to generate a first delay write signal in response to the internal clock signal; and a detection signal output circuit which performs an AND operation on the write signal and the first delay write signal to generate the detection signal and inverts the detection signal to generate the inverted version of the detection signal.

10. A method of generating a write data mask signal in a synchronous memory device, comprising:

latching a write data mask signal for controlling a write data mask operation of the synchronous memory device and activating an internal write data mask signal in response to an internal clock signal;

detecting at least one of an individual write data mask operation and a gapless write data mask operation included in a gapless write operation;

upon detecting the gapless write data mask operation, holding the internal write data mask signal during the gapless write data mask operation and then resetting the activated internal write data mask signal using a write column disable signal indicating an activation end point of a column selection line signal generated when the write operation including the write data mask operation is performed; and upon detecting the individual write data mask operation, resetting the activated internal write data mask signal using the write column disable signal, wherein the detecting is performed in a gapless write operation detection circuit included in a reset control unit of the synchronous memory device for generating a detection signal, and wherein a reset signal for the resetting is generated based on a logic operation for the detection signal, the write column disable signal and a read signal indicating a read operation for the synchronous memory device.

11. The method of claim 10, wherein the detected gapless write operation corresponds to a particular type of synchronous memory device.

* * * * *